United States Patent [19]

Reid et al.

[11] 4,157,550

[45] Jun. 5, 1979

[54] MICROWAVE DETECTING DEVICE WITH MICROSTRIP FEED LINE

[75] Inventors: Martin J. Reid, Chelmsford, Mass.; Robert W. Terry, Moultonboro, N.H.

[73] Assignee: Alpha Industries, Inc., Woburn, Mass.

[21] Appl. No.: 886,037

[22] Filed: Mar. 13, 1978

[51] Int. Cl.² .............................................. H01Q 13/00
[52] U.S. Cl. .................................... 343/786; 343/703; 343/700 MS
[58] Field of Search ................ 343/700 MS, 846, 786, 343/701, 703

[56] References Cited

U.S. PATENT DOCUMENTS

| 3,267,475 | 4/1966 | Howard | 343/786 |
| 3,990,081 | 11/1976 | Guennou | 343/786 |

*Primary Examiner*—David K. Moore
*Attorney, Agent, or Firm*—Charles Hieken

[57] ABSTRACT

A microwave detector comprises a tapered ridged horn that terminates in a ridged waveguide formed with a slot extending through a broad wall of the waveguide and through the ridge that accommodates a stripline positioned so that a pair of diodes are connected across the gap between the ridge and the broad wall and brought out through stepped conductors dimensioned to function as low pass filters.

9 Claims, 6 Drawing Figures

MICROWAVE DETECTING DEVICE WITH MICROSTRIP FEED LINE

BACKGROUND OF THE INVENTION

The present invention relates in general to microwave detecting and more particularly concerns novel apparatus and techniques for providing an economical broadband microwave detector of excellent electrical performance in a compact physical package relatively easy and inexpensive to manufacture that is especially useful in detecting microwave energy at frequencies of both 10.525 GHz and 24.125 GHz.

Common frequency ranges for microwave velocity indicators are 10.525 GHz and 24.125 GHz. A typical detector incorporates a microwave horn feeding a waveguide and conventional diodes located in a cavity shorted at the end from the horn with one diode typically connected to a low frequency signal, such as 1 kHz for chopping received microwave energy and the other diode functioning as a detector to provide a signal at the chopping frequency representative of the intensity of microwave energy incident at the horn mouth. A problem with the prior art approach is that the assembly is relatively costly and difficult to assemble, one problem being obtaining the proper positioning of the diodes.

Accordingly, it is an important object of this invention to provide an improved microwave detector.

It is another object of the invention to achieve the preceding object with an assembly that is relatively easy and inexpensive to fabricate with relatively unskilled production personnel while maintaining good electrical performance on a production basis.

SUMMARY OF THE INVENTION

According to the invention, there is antenna means, such as a microwave horn, for receiving incident microwave energy. Ridged waveguide means is coupled to the antenna means for functioning as a cavity accommodating at least one unilaterally conducting device and having a first broad wall facing the ridge formed with a slot opposite an extension of this slot formed through the free end of the ridge for accommodating a stripline having a first insulated conducting portion seated in the slot opposite an insulatedly separated second conducting portion that passes through the slot to define an insulated gap coextensive with the region between the first broad wall and the ridge and a unilaterally conducting device connected across the gap between said first and second conducting means. Preferably, there is a third conducting means generally parallel to and insulatedly separated from the second conducting means and insulatedly separated from the first and fourth conducting means passing through the slot and second unilaterally conducting means connected between the third conducting means and the fourth conducting means across the gap. The fourth conducting means is generally parallel to and insulatedly separate from the first conducting means.

Numerous other features, objects and advantages of the invention will become apparent from the following specification when read in connection with the accompanying drawing in which:

DETAILED DESCRIPTION OF PREFERRED EMBODIMENTS

Figure 1:
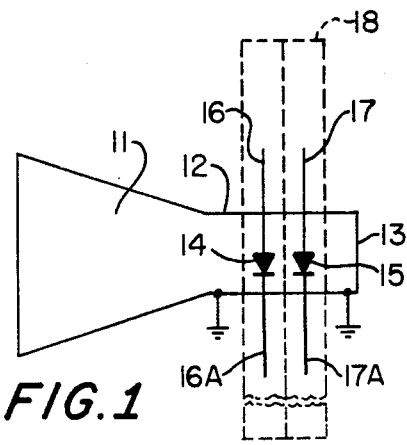
FIG. 1 is a diagrammatic representation of a microwave detector according to the invention.

With reference now to the drawing and more particularly FIG. 1 thereof, there is a diagrammatic representation of a detector according to the invention. The invention comprises a flared horn 11 for receiving input microwave energy connected to a ridged waveguide 12 shorted at end 13 to form a cavity accommodating diodes 14 and 15 having their cathodes connected by 16A and 17A and their anodes connected by leads 16 and 17, respectively, on microstrip 18.

Figure 2:
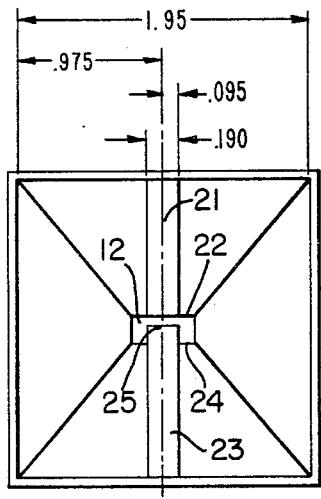
FIG. 2 is a front view of the microwave horn comprising the detector.

Referring to FIG. 2 there is shown a front view of a preferred form of horn 11 having a mouth and formed with an upper ridge 21 extending from the horn mouth to the upper broad wall 22 of ridged waveguide 12 and a lower ridge 23 extending from the mouth to the lower broad wall 24 and ridge 25.

Figure 3:
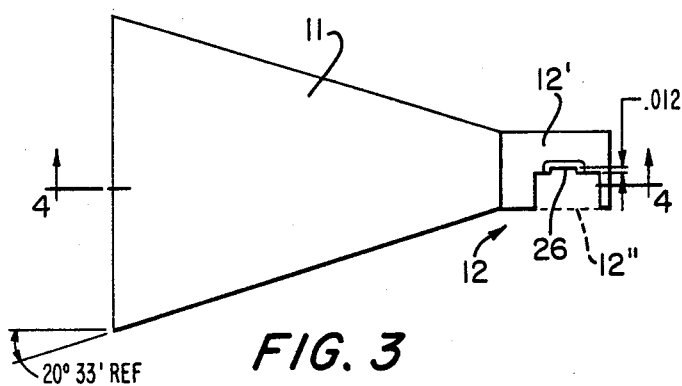
FIG. 3 is a top view of a portion of the invention with broken lines indicating where a mating piece forming part of the ridged waveguide is located.

Referring to FIG. 3, there is shown a top view of the microwave detector comprising the horn 11 and the major portion of ridged waveguide 12' formed with a groove 26, the broken lines representing where the remaining portion 12" of ridged waveguide 12 is located in the finished unit.

Figure 4:
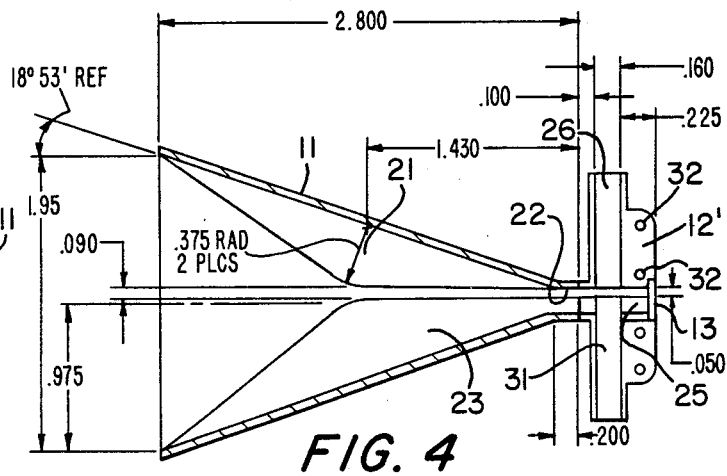
FIG. 4 is a view through section 4—4 of FIG. 3.
Figure 6:
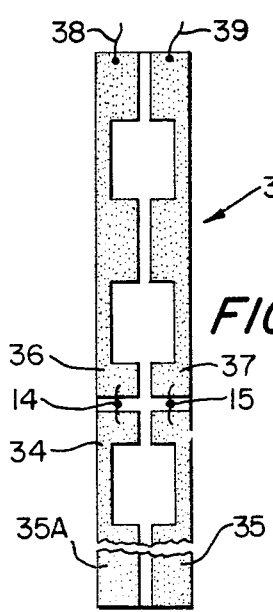
FIG. 6 is a plan view of the microstrip conductors and diodes.

Referring to FIG. 4, there is shown a sectional view through section 4—4 of FIG. 3 that better illustrates the form of upper and lower ridges 21 and 23, slots 26 and 31 and how ridge 25 is formed with a slot 31 for accommodating the end of a stripline that contains the first and fourth conductors shown in FIG. 6. Ridged waveguide portion 12' is formed with tapped or other openings 32 for receiving screws or fasteners that may be used to fasten part 12" of ridged waveguide 12 to portion 12' to complete the assembly.

Figure 5:
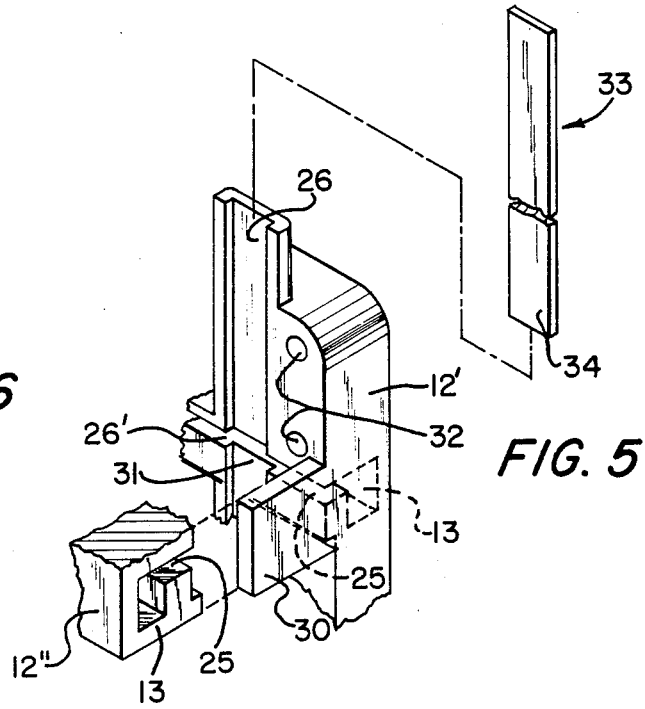
FIG. 5 is an exploded view of fragments of the invention helpful in understanding the relationship among the different components.

Referring to FIG. 5, there is shown an exploded view of parts of the invention, some being fragmentary, helpful in understanding how the invention is assembled. Stripline 33 slides into groove 26 through the slot 26' at the bottom opposite slot 31 until the diodes are located in the ridge gap. Then ridged waveguide portion 12" is bolted to portion 12' to complete the assembly with diodes 14 and 15 properly positioned for good detection at two significantly different frequencies, such as near 10 and 24 GHz.

Referring to FIG. 6, there is shown a plan view of stripline 33 with the two layers of insulating material removed to show the conducting layers and positioning of diodes 14 and 15. One electrode of each of diodes 14 and 15 is connected to first and fourth conducting layers 35A and 35. The other electrode of each of diodes 14 and 15 is connected to second and third conducting strips 36 and 37, respectively, that are stepped as shown to function as low-pass filters so that leads 38 and 39 at the ends of conducting portions 36 and 37, respectively, may be connected to typically a 1 kHz or other suitable frequency oscillator and an amplifier, respectively, the signal on lead 39 then being at 1 kHz of amplitude proportional to the microwave energy incident through the mouth of horn 11. Diodes 14 and 15 are preferably beam-lead diodes. The modulated diode is preferably located between the ridge guide horn and the amplifier diode.

Certain preferred dimensions are set forth in the drawing in inches for a microwave detector especially useful for detecting incident energy at 10.525 and 24.125 GHz. The particular means for fabricating the structure is not a part of the invention. For example, the components may be formed by investment casting or of molded plastic material coated with a conducting layer. Furthermore, the horn and shorting end wall may be made separate from the ridged waveguide portion 12'.

It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:
1. In a microwave detector apparatus comprising,
a ridged waveguide formed with a first longitudinal slot in a first walled structure, said first longitudinal slot facing a second longitudinal slot in the waveguide ridge for accommodating a stripline passing through the slots and diode means mounted on said stripline and located within the ridge gap between said first and second slots means including a second walled structure for covering said slots along their length and antenna means connected to the input of said ridged waveguide.
2. Microwave apparatus in accordance with claim 1 and further comprising,
said stripline extending through said first and second slots.
3. Microwave apparatus in accordance with claim 2 wherein said stripline is formed with first and second insulatedly separated conducting portions, said diode means comprising a first
unilaterally conducting means connected between said first and second conducting portions located in the region therebetween in said ridge gap for establishing a rectifying connection between said first and second conducting portions.
4. Microwave apparatus in accordance with claim 3 and further comprising a third conducting portion generally parallel to said second conducting portion and located in said first slot and outside said second slot and said diode means further comprising,
second unilaterally conducting means in said ridge gap connected between a fourth conducting portion and said third conducting portion for establishing a rectifying connection therebetween.
5. Microwave apparatus in accordance with claim 1 wherein said ridged waveguide is formed by two interlocking pieces each comprising substantially half the width of the ridged waveguide.
6. Microwave apparatus in accordance with claim 5 wherein said first and second slots are located entirely in one of said pieces.
7. Microwave apparatus in accordance with claim 1 wherein said antenna means comprises a microwave horn formed with opposed ridges.
8. Microwave apparatus in accordance with claim 7 wherein said microwave horn and a first piece of said ridged waveguide is a unitary structure that mates with a second piece of said ridged waveguide.
9. Microwave apparatus in accordance with claim 1 wherein said ridged waveguide is shorted at one end forming a cavity.

* * * * *